United States Patent
Oh et al.

(10) Patent No.: US 8,958,502 B2
(45) Date of Patent: *Feb. 17, 2015

(54) TRANSMITTER AND METHOD FOR TRANSMITTING DATA BLOCK IN WIRELESS COMMUNICATION SYSTEM

(71) Applicant: Electronics and Telecommunications Research Institute, Daejeon (KR)

(72) Inventors: Jong Ee Oh, Daejeon (KR); Min Ho Cheong, Daejeon (KR); Sok Kyu Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/218,831

(22) Filed: Mar. 18, 2014

(65) Prior Publication Data

US 2014/0226757 A1    Aug. 14, 2014

Related U.S. Application Data

(63) Continuation of application No. 14/048,999, filed on Oct. 8, 2013, now Pat. No. 8,718,195, which is a (Continued)

(30) Foreign Application Priority Data

Oct. 22, 2010   (KR) .................. 10-2010-0103381
Nov. 8, 2010    (KR) .................. 10-2010-0110160
Oct. 20, 2011   (KR) .................. 10-2011-0107646

(51) Int. Cl.
*H03K 9/00*     (2006.01)
*H04L 27/00*    (2006.01)

(Continued)

(52) U.S. Cl.
CPC ........... *H04L 5/0046* (2013.01); *H03M 13/256* (2013.01); *H03M 13/271* (2013.01);

(Continued)

(58) Field of Classification Search
CPC ..... H04L 27/2626; H04L 1/0041; H04L 1/06; H04L 27/2602; H04B 7/0697
USPC .................... 375/295, 260, 316; 341/54, 180; 370/338

See application file for complete search history.

(56) References Cited

U.S. PATENT DOCUMENTS 6,895,057 B1   5/2005  Balachandran et al.
8,718,195 B2 *  5/2014  Oh et al. ....................... 375/316

(Continued)

FOREIGN PATENT DOCUMENTS

JP   2008-505558 A   2/2008
JP   2013-511886 A   4/2013

(Continued)

OTHER PUBLICATIONS

Bjorn A. Bjerke, "LB-84 Replacement text for 802.11n Draft 1.0 Clause 20.3.4.4 Data Interleaver", IEEE P802.11 Wireless LANs, Apr. 28, 2006, pp. 1-4, vol. 802.11n, Piscataway, NJ USA.

(Continued)

*Primary Examiner* — Curtis Odom

(57) ABSTRACT

Provided are a transmitter and a method for transmitting a data block in a wireless communication system. The method comprises the following steps: encoding an information bit and generating a block coded with an NCBPSS bit; generating two sub-blocks by parsing the coded block; and transmitting the two sub-blocks from the transmitter. By preventing the bits that are contiguous to the encoding block from having continuous identical reliabilities on a signal constellation, the deterioration of the decoding performance of the transmitter can be prevented.

14 Claims, 17 Drawing Sheets

Related U.S. Application Data continuation of application No. 13/749,582, filed on Jan. 24, 2013, now Pat. No. 8,582,686, which is a continuation of application No. 13/591,113, filed on Aug. 21, 2012, now Pat. No. 8,385,463, which is a continuation of application No. PCT/KR2011/007903, filed on Oct. 21, 2011.

(51) Int. Cl.

| | | |
|---|---|---|
| *H04L 5/00* | (2006.01) | |
| *H03M 13/25* | (2006.01) | |
| *H03M 13/27* | (2006.01) | |
| *H03M 13/35* | (2006.01) | |
| *H04B 7/06* | (2006.01) | |
| *H04L 1/06* | (2006.01) | |
| *H04B 7/08* | (2006.01) | |
| *H04L 27/18* | (2006.01) | |
| *H04L 27/26* | (2006.01) | |
| *H04L 27/34* | (2006.01) | |
| *H04L 1/00* | (2006.01) | |
| *H03M 13/11* | (2006.01) | |
| *H03M 13/23* | (2006.01) | |
| *H03M 13/29* | (2006.01) | |

(52) U.S. Cl.
CPC ........... *H03M13/356* (2013.01); *H04B 7/0697* (2013.01); *H04L 1/0618* (2013.01); *H04B 7/08* (2013.01); *H04L 27/186* (2013.01); *H04L 27/2627* (2013.01); *H04L 27/3416* (2013.01); *H04L 1/0041* (2013.01); *H04L 1/0057* (2013.01); *H04L 1/06* (2013.01); *H03M 13/1102* (2013.01); *H03M 13/23* (2013.01); *H03M 13/2957* (2013.01); *H04L 5/0026* (2013.01)
USPC ............. 375/316; 375/260; 370/338; 341/54; 341/180

(56) References Cited

U.S. PATENT DOCUMENTS

| | | |
|---|---|---|
| 2002/0136318 A1 | 9/2002 | Gorokhov et al. |
| 2007/0139229 A1 | 6/2007 | Berens |
| 2007/0147521 A1 | 6/2007 | Horng et al. |
| 2008/0107097 A1 | 5/2008 | Houze et al. |
| 2009/0113274 A1 | 4/2009 | Lee |
| 2009/0252248 A1 | 10/2009 | Ghosh et al. |
| 2010/0169738 A1 | 7/2010 | Wu et al. |
| 2010/0226415 A1 | 9/2010 | Mehta et al. |
| 2011/0317676 A1* | 12/2011 | Liao et al. ............... 370/338 |
| 2012/0076219 A1 | 3/2012 | Srinivasa et al. |
| 2012/0263156 A1* | 10/2012 | Abraham et al. .......... 370/338 |

FOREIGN PATENT DOCUMENTS

| | | |
|---|---|---|
| JP | 2003-523645 A | 8/2013 |
| JP | 2013-545346 A | 12/2013 |
| KR | 10-2009-0014727 A | 2/2009 |
| WO | WO 00/27064 A1 | 5/2000 |
| WO | WO 2006/007571 A1 | 1/2006 |
| WO | WO 2011/136582 A2 | 11/2011 |
| WO | WO 2012/044457 A1 | 4/2012 |
| WO | WO 2012/047758 A1 | 4/2012 |
| WO | WO 2012/051319 A1 | 4/2012 |

OTHER PUBLICATIONS

Robert Stacey et al., "Specification Framework for TGac", IEEE P802.11 Wireless LANs, Nov. 9, 2010, pp. 1-35, vol. 802.11ac, No. 16, Piscataway, NJ USA.
The extended European search report for Application No. EP 11834666 dated May 9, 2014.
Office Action and List of References for U.S. Appl. No. 13/591,094 mailed Nov. 15, 2012.
International Search Report for PCT/KR2011/007903 filed on Oct. 21, 2011.
Robert Stacey et al., "Specification Framework for TGac", IEEE P802.11 Wireless LANs, Sep. 16, 2010, pp. 1-12.

\* cited by examiner

FIG. 8
BPSK, QPSK
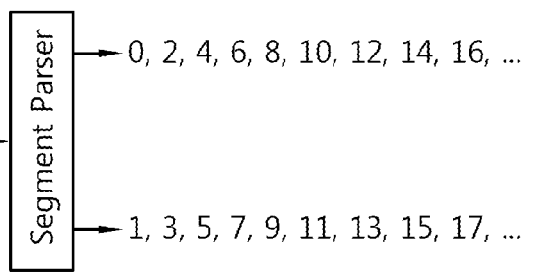
16 QPSK
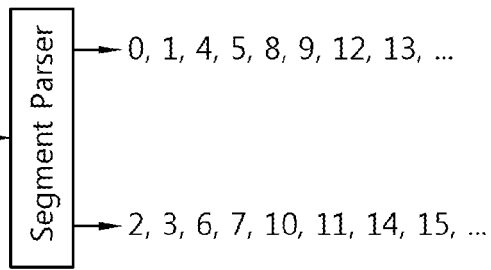
64 QPSK
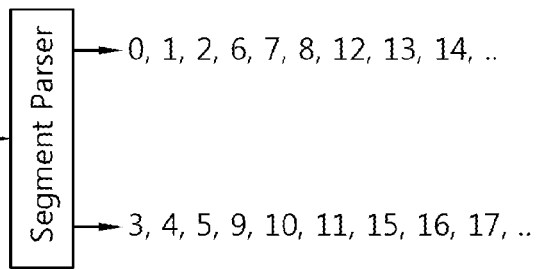
256 QPSK
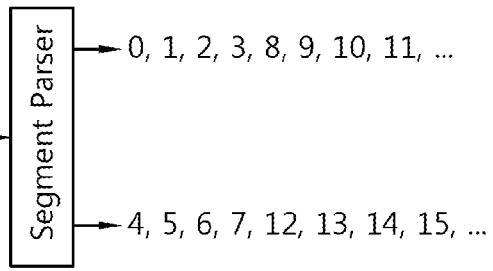

TRANSMITTER AND METHOD FOR TRANSMITTING DATA BLOCK IN WIRELESS COMMUNICATION SYSTEM

CROSS-REFERENCES

The present application is a continuation of U.S. patent application Ser. No. 14/048,999, filed on Oct. 8, 2013, which is a continuation of U.S. patent application Ser. No. 13/749,582, filed on Jan. 24, 2013, which is a continuation of U.S. patent application Ser. No. 13/591,113, filed on Aug. 21, 2012, which is a continuation of PCT/KR2011/007903, filed on Oct. 21, 2011, which claims priority of Korean Patent Application Number 10-2010-0103381, filed on Oct. 22, 2010, Korean Patent Application Number 10-2010-0110160, filed on Nov. 8, 2010, and Korean Patent Application Number 10-2011-0107646, filed on Oct. 20, 2011, which are incorporated by reference in their entirety.

TECHNICAL FIELD

The present invention relates to wireless communication, and more particularly, to a method of transmitting a data block in a wireless communication system, and a transmitter.

BACKGROUND ART

Recently, various wireless communication technologies are under development in accordance with the advancement of information communication technology. Among them, a wireless local area network (WLAN) is a technique allowing mobile terminals such as personal digital assistants (PDAs), lap top computers, portable multimedia players (PMPs), and the like, to wirelessly access the Internet at homes, in offices, or in a particular service providing area, based on a radio frequency technology.

As a technology specification that has been relatively recently legislated in order to overcome a limitation in a communication speed that has been pointed out as a weak point in the WLAN, there is the IEEE (Institute of Electrical and Electronics Engineers) 802.11n. An object of the IEEE 802.11n is to increase a speed and reliability of a wireless network and extend an operating distance of the wireless network. More specifically, the IEEE 802.11n is based on multiple inputs and multiple outputs (MIMO) technology in which multiple antennas are used at both of a transmitting end and a receiving end in order to support a high throughput (HT) having a maximum data processing speed of 540 Mbps or more, minimize a transmission error, and optimize a data speed. Further, in this specification, a coding scheme of transmitting several overlapped duplicates may be used in order to increase data reliability, and an orthogonal frequency division multiplexing (OFDM) scheme may also be used in order to increase a speed.

In the wireless communication system, codewords are generally interleaved over the entire frequency band in order to obtain a frequency diversity gain and maximize an interleaving effect. When a size of a used frequency band increases, a coding gain and a diversity gain are obtained by increasing a codeword and an interleaver to the size of the frequency band.

However, when the size of the interleaver is increased in accordance with an increase in size of the frequency band, a burden on changing an existing structure and complexity may increase.

DISCLOSURE

Technical Problem

The present invention provides a method of transmitting a data block capable of supporting a broadband in a wireless local area network system, and a transmitter.

Technical Solution

In an aspect, a method of transmitting a data block in a wireless communication system is provided. The method includes encoding information bits to generate a coded block of $N_{CBPSS}$ bits, parsing the coded block to generate two subblocks with index l=0, 1, and transmitting the two subblocks to a receiver. The coded block is parsed as shown:

$$y_{k,l} = x_{2s \cdot N_{ES} \lfloor \frac{k}{s \cdot N_{ES}} \rfloor + l \cdot s \cdot N_{ES} + k \bmod (s \cdot N_{ES})}, k = 0, 1, \ldots, \frac{N_{CBPSS}}{2} - 1$$

where $$s = \max\left\{1, \frac{N_{BPSCS}}{2}\right\},$$

$N_{BPSCS}$ is the number of coded bits per subcarrier per spatial stream,
$N_{ES}$ is the number of encoders,
$\lfloor z \rfloor$ is the largest integer less than or equal to z,
z mod t is the remainder resulting from the division of integer z by integer t,
$x_m$, is the m-th bit of a block of bits, m=0 to $N_{CBPSS}$−1, and
$y_{k,l}$ is bit k of the subblock l.
Each of the two subblocks may be interleaved by an interleaver.
The two subblocks may correspond to two frequency bands respectively.
Each of the two frequency bands may have a bandwidth of 80 MHz.
The two frequency bands may be contiguous.
The two frequency bands may not be non-contiguous.
In another aspect, a transmitter of transmitting a data block in a wireless communication system is provided. The transmitter includes a coding unit configured to encode information bits to generate a coded block of $N_{CBPSS}$ bits, a parsing unit configured to parse the coded block to generate two subblocks with index l=0, 1, and a transmission unit configured to transmit the two subblocks to a receiver. The parsing unit is configured to parse the coded block as shown above.
In still another aspect, a method of transmitting a data block in a wireless communication system is provided. The method includes generating a coded block of $N_{CBPSS}$ bits, parsing the coded block to generate two subblocks with index l=0, 1, and transmitting the two subblocks to a receiver. The coded block is parsed as shown:

$$y_{k,l} = \begin{cases} x_{2s \cdot N_{ES} \lfloor \frac{k}{s \cdot N_{ES}} \rfloor + l \cdot s \cdot N_{ES} + k \bmod (s \cdot N_{ES})}, \\ k = 0, 1, \ldots, \lfloor N_{CBPSS}/(2s \cdot N_{ES}) \rfloor s \cdot N_{ES} - 1 \\ x_{2s \cdot N_{ES} \lfloor \frac{k}{s \cdot N_{ES}} \rfloor + 2s \lfloor \frac{k \bmod (s \cdot N_{ES})}{s} \rfloor + k \bmod s}, \\ k = \lfloor N_{CBPSS}/(2s \cdot N_{ES}) \rfloor s \cdot N_{ES}, \ldots, \frac{N_{CBPSS}}{2} - 1 \end{cases}$$

In still another aspect, a method of transmitting a data block in a wireless communication system is provided. The method includes determining a number of bits assigned to a single axis of a signal constellation, s, and a number of encoders, $N_{ES}$, encoding information bits to generate a coded block of $N_{CBPSS}$ bits based on s and $N_{ES}$, parsing the coded block to generate a plurality of frequency subblocks based on s and $N_{ES}$, and transmitting the plurality of frequency subblocks to a receiver.

In still another aspect, a method of transmitting a data block in a wireless communication system is provided. The method includes determining a number of bits assigned to a single axis of a signal constellation, s, and a number of encoders, $N_{ES}$, generating a coded block, parsing the coded block to generate a plurality of frequency subblocks in unit of $sN_{ES}$ bits, and transmitting the plurality of frequency subblocks to a receiver.

Advantageous Effects

It is possible to prevent decoding performance of a receiver from being deteriorated by allowing contiguous bits of an encoding block not to continuously have the same reliability on a signal constellation.

DESCRIPTION OF DRAWINGS

FIG. 8 is a diagram showing an example of segment parsing according to the exemplary embodiment of the present invention.

MODE FOR INVENTION

A wireless local area network (WLAN) system in which an exemplary embodiment of the present invention is implemented includes at least one basic service set (BSS). The BSS is a set of successfully synchronized stations (STA) in order to perform communication therebetween. The BSS may be divided into an independent BSS (IBSS) and an infrastructure BSS.

The BSS may include at least one STA and access point (AP). The STA may be an AP or non-AP STA. The AP is a functional medium connecting the STAs in the BSS to each other through a wireless medium. The AP may be called other names such as a centralized controller, a base station (BS), a scheduler, and the like.

Figure 1:
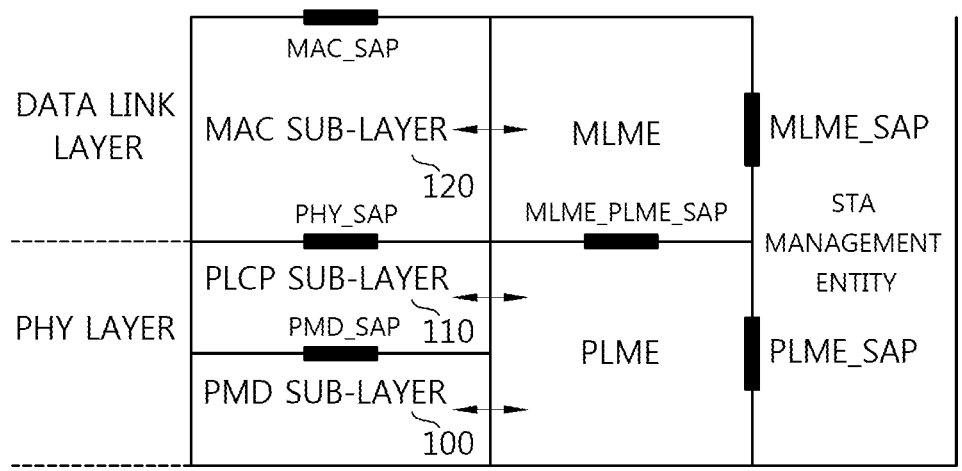
FIG. 1 is a diagram showing an architecture of the IEEE 802.11.

FIG. 1 is a diagram showing an architecture of the IEEE 802.11.

The wireless-medium physical layer (PHY) architecture of the IEEE 802.11 includes a PHY layer management entity (PLME) layer, that is, a physical layer convergence procedure (PLCP) sub-layer 110, a physical medium dependent (PMD) sub-layer 110.

The PLME provides a management function of the PHY in cooperation with a medium access control (MAC) layer management entity (MLME).

The PLCP sub-layer 110 transfers an MAC protocol data unit (MPDU) received from the MAC sub-layer 120 to a PMD sub-layer 100 or transfers a frame coming from the PMD sub-layer 100 to the MAC sub-layer 120 according to instruction of the MAC layer, between the MAC sub-layer 120 and the PMD sub-layer 100.

The PMD sub-layer 100, which is a lower layer of the PLCP, may allow a PHY entity to be transmitted and received between two STAs through a wireless medium.

The MPDU transferred from the MAC sub-layer 120 is called a physical service data unit (PSDU) in the PLCP sub-layer 110. The MPDU is similar to the PSDU. However, when an aggregated MPDU (A-MPDU) in which a plurality of MPDUs are aggregated is transferred, individual MPDUs and PSDUs may be different.

The PLCP sub-layer 110 adds an additional field including information required by a physical layer transceiver to the PSDU during a process of receiving the PSDU from the MAC sub-layer 120 and transferring the PSDU to the PMD sub-layer 100. Here, the field added to the MPDU may be a PLCP preamble, a PLCP header, tail bits required on a data field, or the like. The PLCP preamble serves to allow a receiver to prepare a synchronization function and antenna diversity before the PSDU is transmitted. The PLCP header includes a field including information on a frame.

The PLCP sub-layer 110 adds the above-mentioned field to the PSDU to generate a PLCP protocol data unit (PPDU) and transmit the PPDU to a receiving station through the PMD sub-layer. The receiving station receives the PPDU and obtains information required for recovering data from the PLCP preamble and the PLCP header to recover the data.

Figure 2:
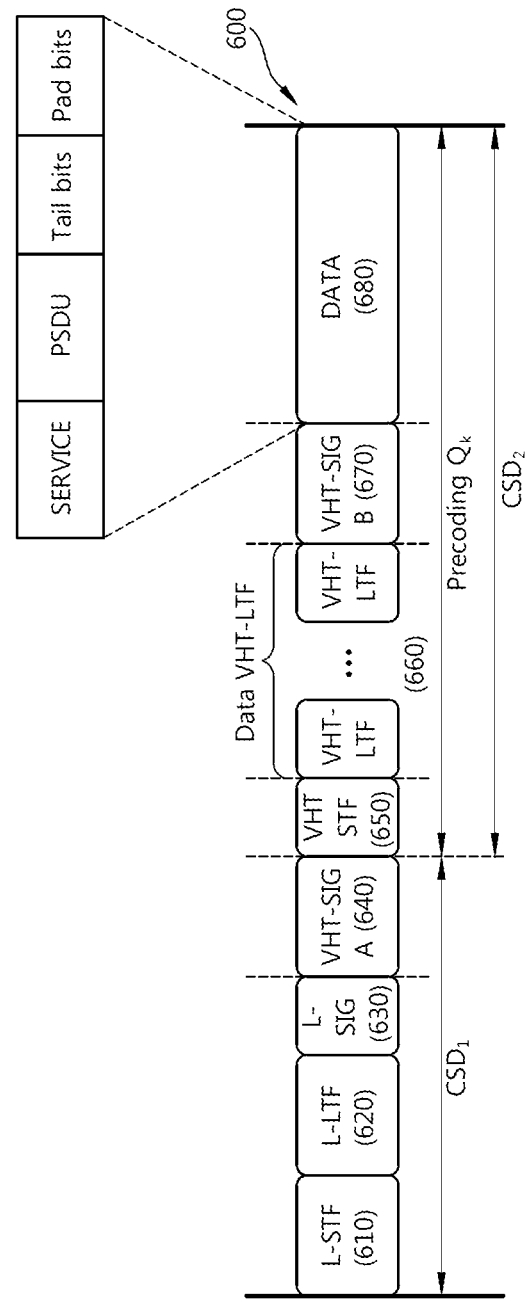
FIG. 2 is a block diagram showing an example of a physical layer convergence procedure (PLCP) protocol data unit (PPDU) format.

FIG. 2 is a block diagram showing an example of a physical layer convergence procedure (PLCP) protocol data unit (PPDU) format.

The PPDU 600 may include a legacy-short training field (L-STF) 610, a legacy-long training field (L-LTF) 620, a legacy-signal (L-SIG) field 630, a very high throughput (VHT)-SIGA field 640, a VHT-STF 650, a VHT-LTF 660, a VHT-SIGB 670, and a data field 680.

The L-STF 610 is used for frame timing acquisition, automatic gain control (AGC), coarse frequency acquisition, or the like.

The L-LTF 620 is used for channel estimation for demodulation of the L-SIG field 630 and the VHT-SIGA field 640.

The L-SIG field 630 includes control information on a transmission time of the PPDU.

The VHT-SIGA field 640 includes common information required for the STAs supporting the MIMO transmission to receive a spatial stream. The VHT-SIGA field 640 includes information on the spatial streams for each STA, channel bandwidth information, a group identifier, information on an STA to which each ground identifier is allocated, a short guard interval (GI), beamforming information (including whether the MIMO is SU-MIMO or MU-MIMO).

The VHT-STF 650 is used to improve performance of AGC estimation in the MIMO transmission.

The VHT-LTE 660 is used for each STA to estimate MIMO channels.

The VHT-SIGB field 670 includes individual control information on each STA. The VHT-SIGB field 670 includes information on a modulation and coding scheme (MCS). A size of the VHT-SIGB field 670 may be changed according to a type of MIMO transmission (MU-MIMO or SU-MIMO) and a bandwidth of a channel used for transmission the PPDU.

The data field 680 includes the PSDU transferred from the MAC layer, a service field, tail bits, and pad bits if needed.

In order to support a higher data rate, the WLAN system may support various bandwidths. For example, the bandwidth supported by the WLAN system may include at least any one of 20 MHz, 40 Hz, 80 MHz, and 160 MHz. In addition, since continuous bandwidths may not be always used, non-contiguous bands may be used. For example, a bandwidth of 160 MHz is supported using two non-contiguous 80 MHz bands (represented by 80+80 MHz).

Hereinafter, a contiguous 160 MHz band and a non-contiguous 80+80 MHz band will be described by way of example. However, sizes or the number of bandwidths are not limited.

The WLAN system may support the MU-MIMO and/or the SU-MIMO. Hereinafter, the SU-MIMO will be described by way of example. However, it may be easily appreciated by those skilled in the art that this description may also be to the MU-MIMO.

Figure 3:
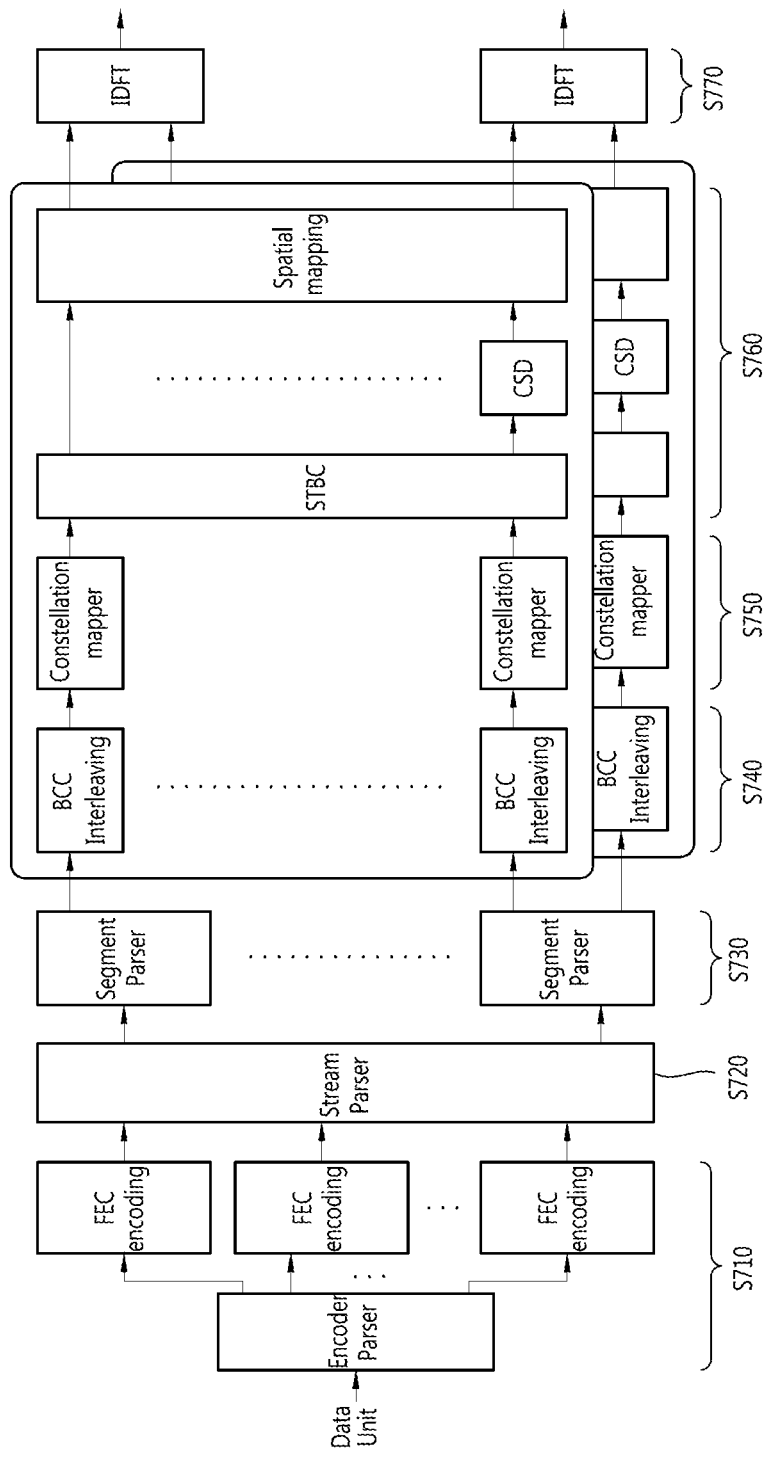
FIG. 3 is a block diagram showing an example of a transmitter in which an exemplary embodiment of the present invention is implemented in contiguous bands.

FIG. 3 is a block diagram showing an example of a transmitter in which an exemplary embodiment of the present invention is implemented in contiguous bands.

A data unit is encoded by at least one forward error correction (FEC) encoder (S710). The data unit includes PHY pad bits added to the PSDU and scrambled information bits. The data unit may be divided into bit sequences having a specific bit size by an encoder parser, and each of the bit sequences may be input to each FEC encoder.

An encoding scheme may be a binary convolution code (BCC). However, a disclosed encoding scheme is only an example, and the scope and spirit of the present invention may be applied to a well-known encoding scheme such as a low-density parity-check (LDPC), a turbo code, or the like, by those skilled in the art.

The encoded data units are rearranged into NSS spatial blocks by a stream parser (S720). $N_{SS}$ indicates the number of spatial streams.

Output bits of each stream parser are divided into two frequency subblocks (S730). One frequency subblock may correspond to a bandwidth of 80 MHz.

Each of the two frequency subblocks is independently interleaved by a BCC interleaver (S740). The interleaver may have a size corresponding to 20 MHz, 40 MHz, and 80 MHz. Since one frequency subblock corresponds to a 80 MHz band, the frequency subblocks may be interleaved by an interleaver corresponding to 80 MHz.

Each of the interleaved frequency subblocks is independently mapped onto a signal constellation by a constellation mapper (S750). The signal constellation may correspond to various modulation schemes such as binary phase shift keying (BPSK), quadrature phase-shift keying (QPSK), 16-quadrature amplitude modulation (QAM), 64-QAM, or 256-QAM, but is not limited thereto.

The mapped subblocks are spatially mapped using space-time block coding (STBC) and cyclic shift delay (CSD) (S760).

Two spatially mapped subblocks are subjected to inverse discrete Fourier transform (IDFT) and then transmitted (S770).

Figure 4:
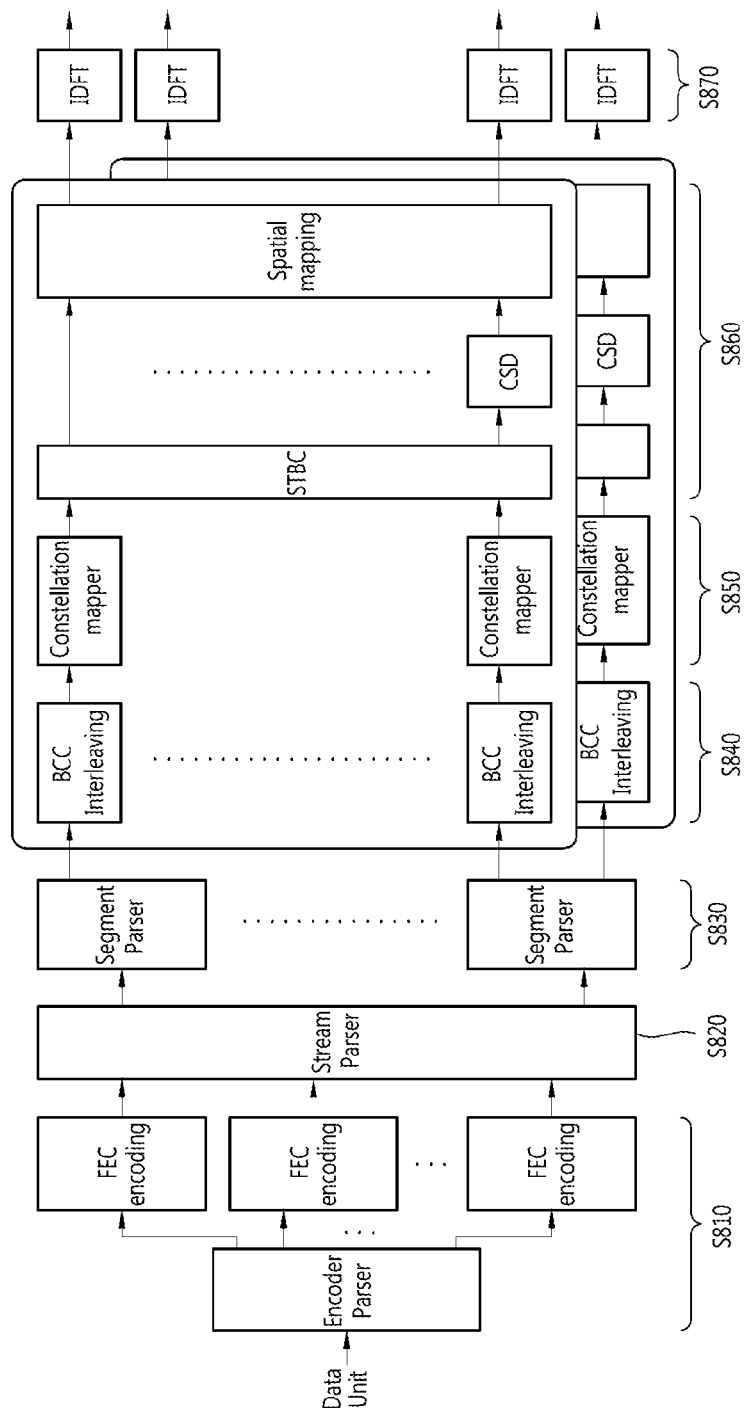
FIG. 4 is a block diagram showing an example of a transmitter in which the exemplary embodiment of the present invention is implemented in non-contiguous bands.

FIG. 4 is a block diagram showing an example of a transmitter in which the exemplary embodiment of the present invention is implemented in non-contiguous bands.

In comparison with the transmitter of FIG. 3, each of the two frequency subblocks is independently subjected to the IDFT. Since each of the frequency subblocks corresponds to the 80 MHz band and the bandwidth of 80 MHz is non-contiguous, each of the two frequency subblocks is independently subjected to the IDFT.

The segment parser parses the encoded data unit into a plurality of frequency subblocks. This is to support a wider bandwidth without increasing a size of the BCC interleaver.

For example, assume that an existing BCC interleaver supports a bandwidth up to 80 MHz. In order to support a bandwidth of 160 MHz, the BCC interleaver cannot but be changed so as to support 160 MHz. However, the data stream is parsed into the subblocks having a size of a frequency bandwidth supported by the BCC interleaver using the segment parser. Therefore, it is possible to support a wider bandwidth and obtain a frequency diversity gain, without changing a size of the interleaver.

Hereinafter, the following parameters will be defined.

$N_{CBPS}$: number of coded bits per symbol $N_{CBPSS}$: number of coded bits per symbol per spatial stream $N_{BPSC}$: number of coded bits per subcarrier over all spatial streams)

$N_{BPSCS}$: number of coded bits per subcarrier per spatial stream)

$N_{SS}$: number of spatial streams $N_{ES}$: number of encoders for data field. Here, it is assumed that the number of encoders is the same as that of codewords.

R: code rate

Figure 5:
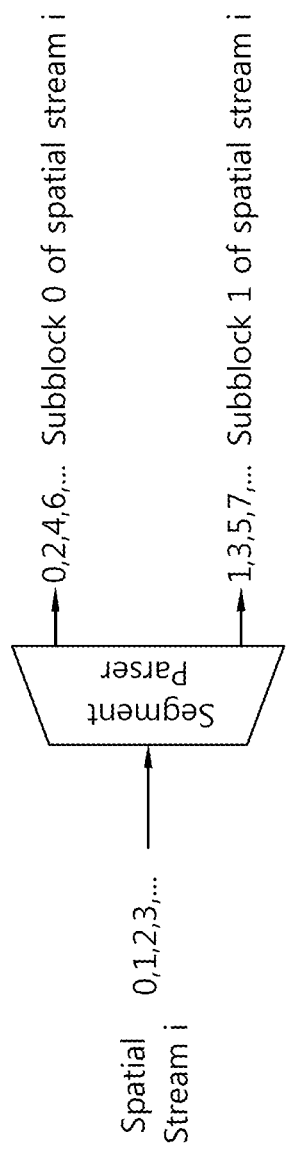
FIG. 5 is a diagram showing an example of segment parsing.

FIG. 5 is a diagram showing an example of segment parsing. The existing suggested simplest segment parsing is to allocate even bits to a first subblock and allocate odd bits to a second subblock for each spatial stream.

Figure 6:
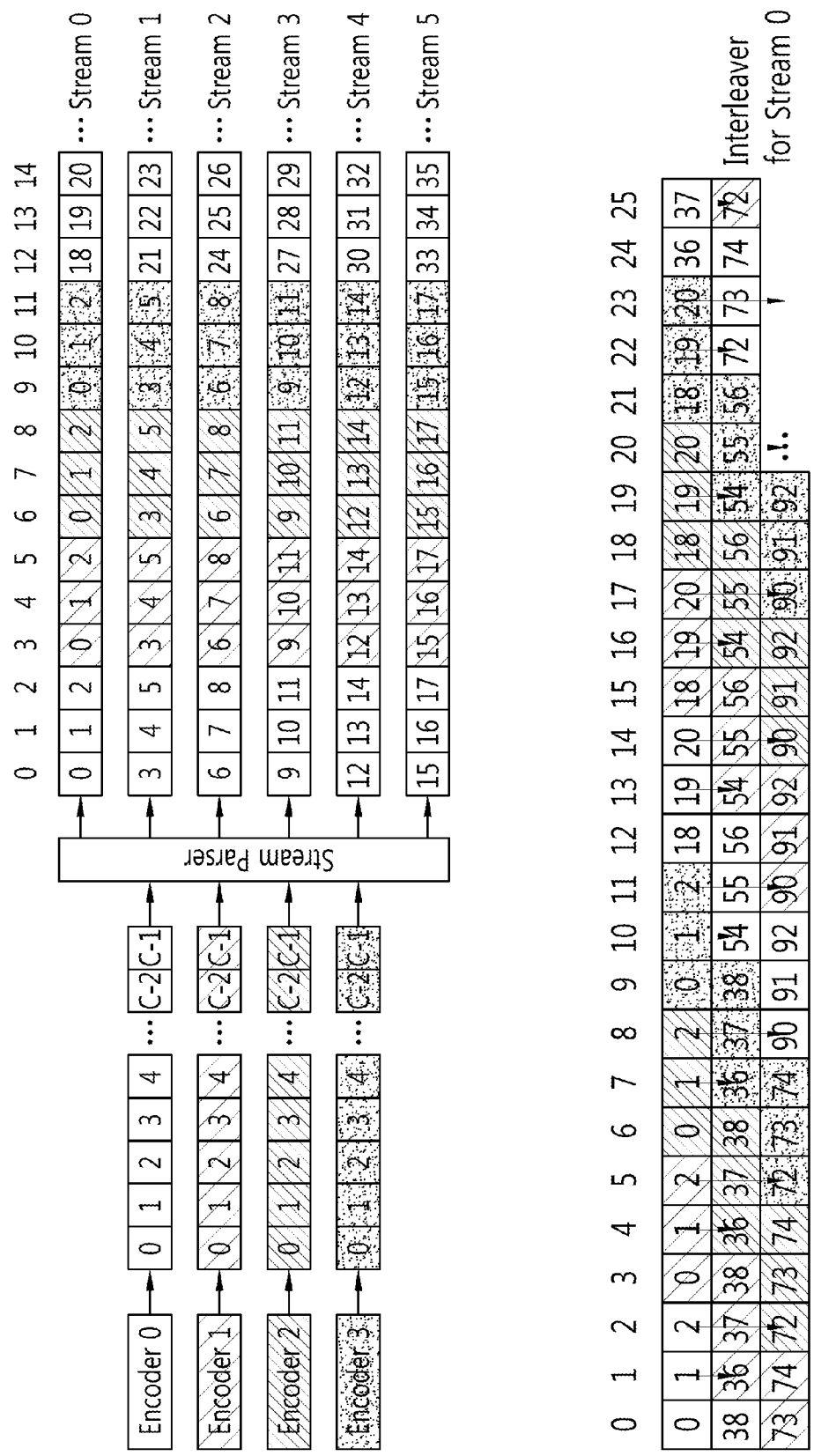
FIG. 6 is an example of showing an example in which the segment parsing of FIG. 5 is used.

FIG. 6 is an example of showing an example in which the segment parsing of FIG. 5 is used. In the case of FIG. 6, a modulation scheme is 64-QAM, $N_{ES}$ is 4, $N_{SS}$ is 6, R is 6/5, and a bandwidth is 80 MHz.

The number of bits corresponding to a Q-axis (or an I-axis) of a 64-QAM signal constellation is 3. Therefore, an output of an encoder is allocated 3-bit by 3-bit in a round robin scheme for each spatial stream. Each spatial stream is parsed by the stream parser to generate subblocks.

The generated subblocks are interleaved by an interleaver. Interleaver input bits are sequentially filled in 26 rows, $3j$, $3j+1$, and $3j+2$ rows of a $3i$-th row are mapped to a signal constellation as they are, and $3j$, $3j+1$, and $3j+2$ rows of a $3i+1$-th row are cyclically shifted downwardly by a single column and then mapped to the signal constellation. $3j$, $3j+1$, and $3j+2$ rows of a $3i+2$-th row are cyclic-shifted downwardly by two columns and then mapped to the signal constellation.

Under the above-mentioned conditions, continuous bits of a codeword are mapped to positions having different reliabilities on the signal constellation.

Figure 7:
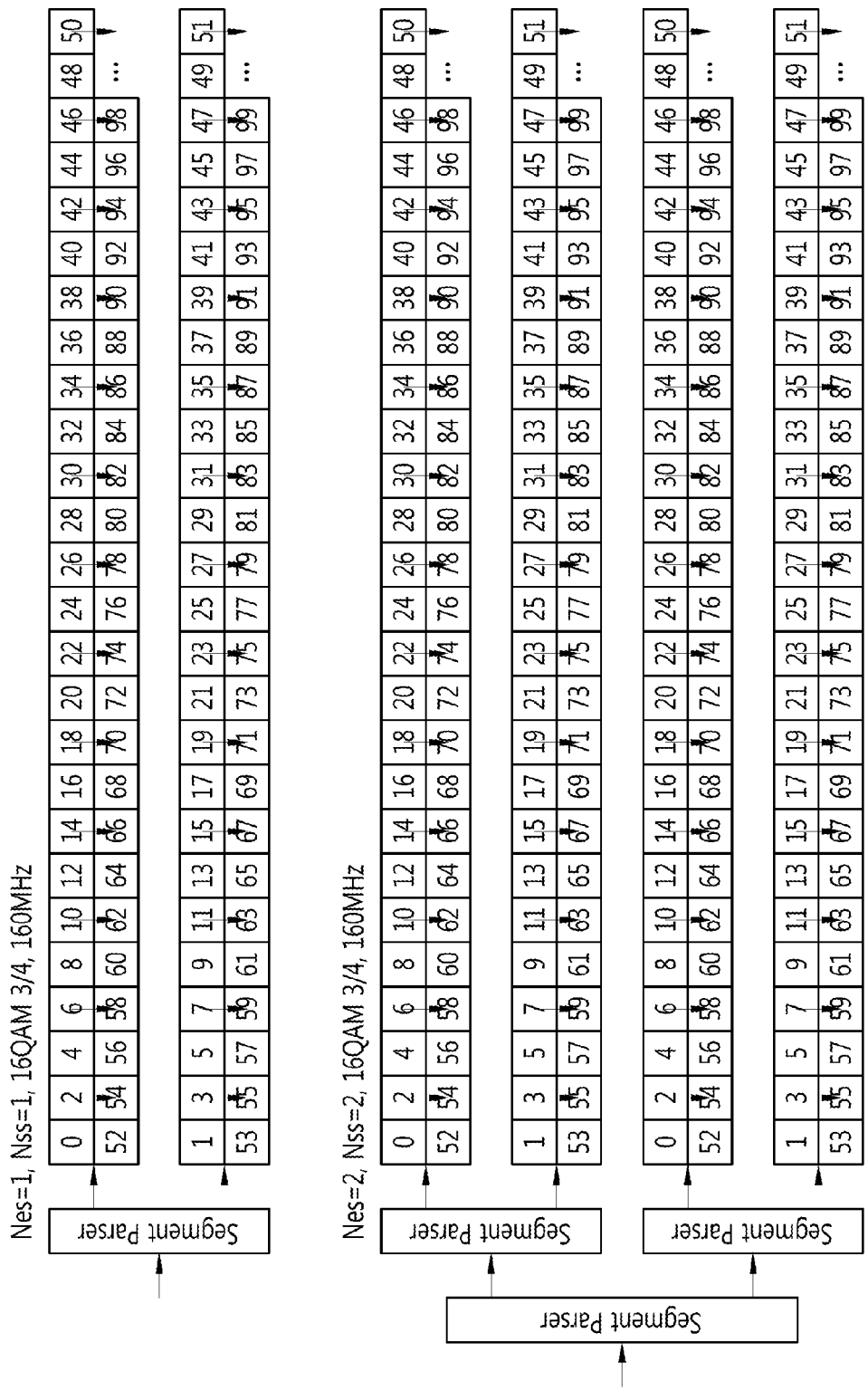
FIG. 7 is an example showing another example in which the segment parsing of FIG. 5 is used.

FIG. 7 is an example showing another example in which the segment parsing of FIG. 5 is used. In the case of FIG. 7, a modulation scheme is 64-QAM, $N_{ES}$ is 1 or 2, $N_{SS}$ is 1, R is 6/5, and a bandwidth is 160 MHz. Unlike the example of FIG. 6, under these conditions, the continuous bits of the codeword are continuously mapped to positions having the same reliability on the signal constellation.

When the bits of the codeword continuously have the same reliability on the signal constellation, decoding performance of a receiver may be significantly deteriorated. The reason is that when a channel state is deteriorated in the reliability, an error may occur.

Therefore, the exemplary embodiment of the present invention suggests segment parsing allowing the bits of the codeword not to continuously have the same reliability on the signal constellation.

In the suggested segment parsing, the number of encoders and the number of bits allocated to one axis of the signal constellation are considered.

The number s of bits allocated to one axis of the signal constellation is considered as follows:

$$s = \max\left\{1, \frac{N_{BPSCS}}{2}\right\} \quad \text{[Equation 1]}$$

For example, when a modulation scheme is BPSK or QPSK, s is 1, when a modulation scheme is 16-QAM, s is 2, when a modulation scheme is 64-QAM, s is 4, and when a modulation scheme is 256-QAM, s is 4.

FIG. 8 is a diagram showing an example of segment parsing according to the exemplary embodiment of the present invention. FIG. 8 shows an example in which bits are allocated to two frequency subblocks in an s unit for each of spatial streams according to each modulation scheme.

Figure 9:
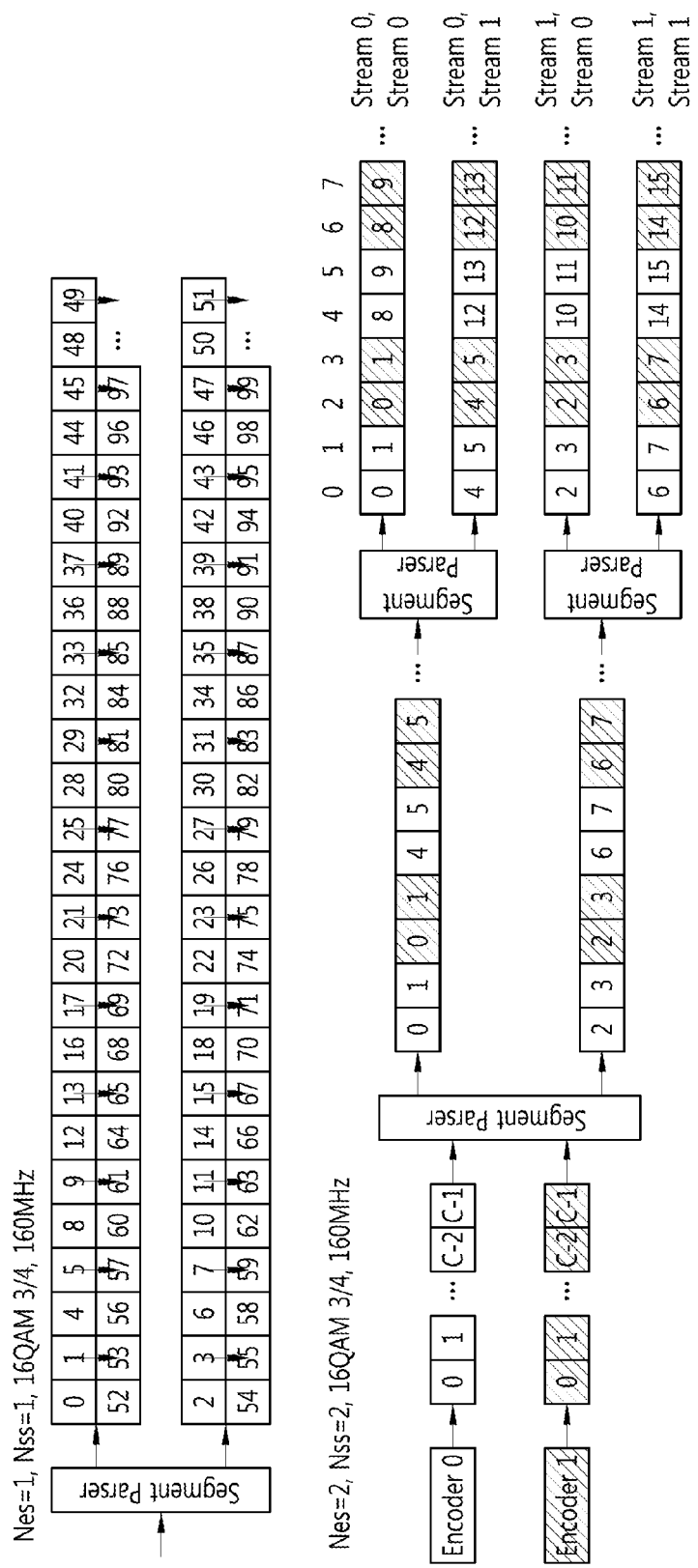
FIG. 9 is a diagram showing another example of segment parsing according to the exemplary embodiment of the present invention.

FIG. 9 is a diagram showing another example of segment parsing according to the exemplary embodiment of the present invention. In this example, outputs of each of encoders are bounded. That is, the outputs of the encoders are parsed in an $sN_{ES}$ unit for each of spatial streams.

Contiguous bits of a codeword may be mapped so as to have different reliabilities on a signal constellation.

The example of FIG. 9 is mathematically shown as follows.

Output bits of each of spatial stream parsers are divided into blocks of $N_{CBPSS}$ bits. Each of the blocks is parsed into two frequency subblocks of $N_{CBPSS}/2$ bits as shown by the following Equation 2:

$$y_{k,l} = x_{2s \cdot N_{ES}\lfloor \frac{k}{s \cdot N_{ES}} \rfloor + l \cdot s \cdot N_{ES} + k \bmod (s \cdot N_{ES})}, \quad \text{[Equation 2]}$$

$$k = 0, 1, \ldots, \frac{N_{CBPSS}}{2} - 1$$

where $\lfloor z \rfloor$ is the largest integer less than or equal to z, z mod t is the remainder resulting from the division of integer z by integer t, $x_m$, is the m-th bit of a block of $N_{CBPSS}$ bits (m=0, . . . , $N_{CBPSS}$-1), l is the subblock index, and l=0, 1, $y_{k,l}$ is the k-th bit of a subblock l.

Meanwhile, when the number of bits of a coded block (that is, the number of bits of an i-th spatial block) is not a multiple of $2sN_{ES}$, residue bits that are not allocated to the frequency subblocks may be present. That is, when the number of bits of the coded block is not divided by $2sN_{ES}$, a method of allocating the residue bits is problematic. Typically, the following cases in a bandwidth of 160 MHz are problematic.

(1) 64-QAM, R=2/3, $N_{SS}$=5, $N_{ES}$=5
(2) 64-QAM, R=2/3, $N_{SS}$=7, $N_{ES}$=7
(3) 64-QAM, R=3/4, $N_{SS}$=5, $N_{ES}$=5
(4) 64-QAM, R=3/4, $N_{SS}$=7, $N_{ES}$=7

Figure 10:
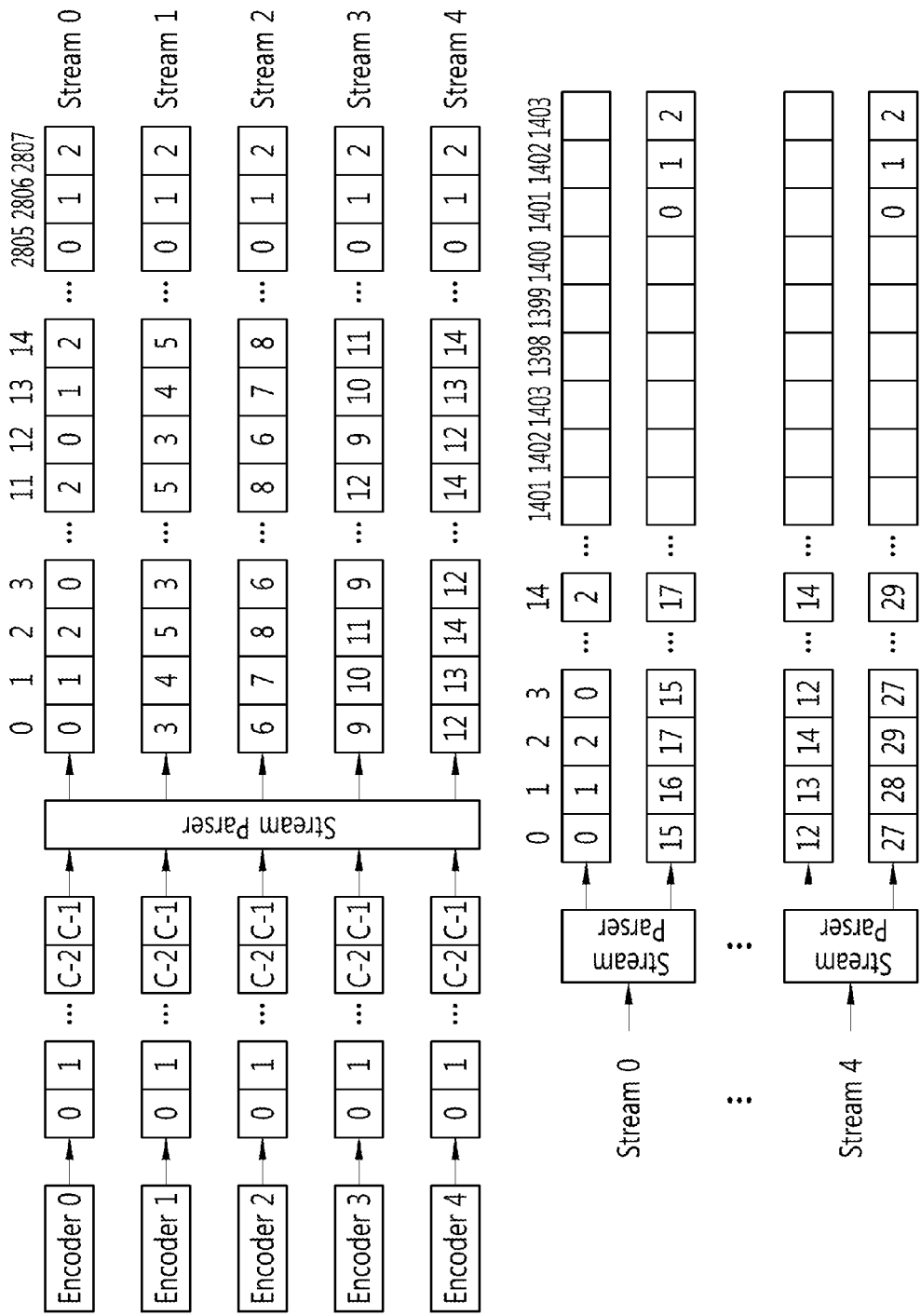
FIG. 10 is a diagram showing segment parsing according to the exemplary embodiment of the present invention.

FIG. 10 is a diagram showing segment parsing according to the exemplary embodiment of the present invention.

Bits up to $\lfloor N_{CBPSS}/(2sN_{ES}) \rfloor sN_{ES}$ are parsed as shown by Equation 2. Here, 2sQ (Q=($N_{CBPSS}$ mod $2sN_{ES}$)/(2s)) residue bits that are not parsed remain. Then, the residue bits are divided by subsets of s bits. Each of the subsets is allocated to different subblocks in the round robin scheme. A first s bit is allocated to a first subblock (l=0). That is, a bundle of s bits is sequentially allocated to first and second subblocks.

That is, when $N_{CBPSS}$ is not divided by $2sN_{ES}$, each block is parsed into two frequency subblocks of $N_{CBPSS}/2$ bits as shown by the following Equation 3:

$$y_{k,l} = \begin{cases} x_{2s \cdot N_{ES}\lfloor \frac{k}{s \cdot N_{ES}} \rfloor + l \cdot s \cdot N_{ES} + k \bmod (s \cdot N_{ES})}, & \text{[Equation 3]} \\ \quad k = 0, 1, \ldots, \lfloor N_{CBPSS}/(2s \cdot N_{ES}) \rfloor s \cdot N_{ES} - 1 \\ x_{2s \cdot N_{ES}\lfloor \frac{k}{s \cdot N_{ES}} \rfloor + 2s \lfloor \frac{k \bmod (s \cdot N_{ES})}{s} \rfloor + k \bmod s}, \\ \quad k = \lfloor N_{CBPSS}/(2s \cdot N_{ES}) \rfloor s \cdot N_{ES}, \ldots, \frac{N_{CBPSS}}{2} - 1 \end{cases}$$

Equation 3 additionally shows allocation of the residue bits in Equation 2.

Figure 11:
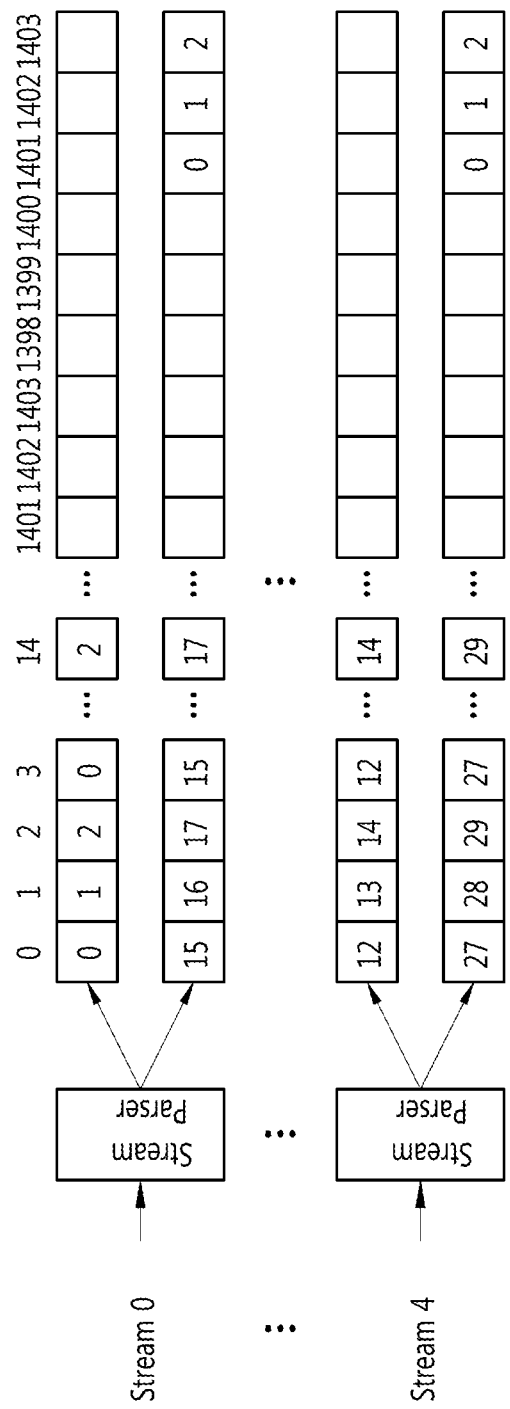
FIG. 11 is a diagram showing segment parsing according to another exemplary embodiment of the present invention.

FIG. 11 is a diagram showing segment parsing according to another exemplary embodiment of the present invention.

Bits up to $\lfloor N_{CBPSS}/(2sN_{ES}) \rfloor sN_{ES}$ are parsed as shown by Equation 2. Then, the residue bits are divided by subsets of 2 bits. Each of the subsets is allocated to different subblocks in the round robin scheme.

Figure 12:
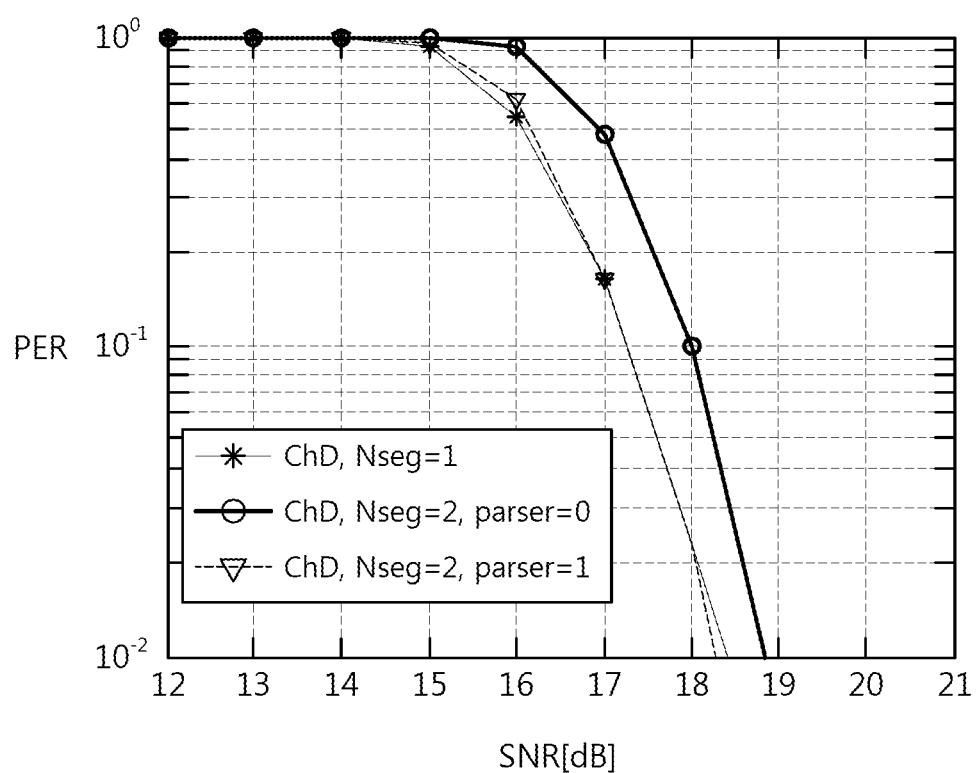
FIGS. 12 to 14 are diagrams showing simulation results.
Figure 13:
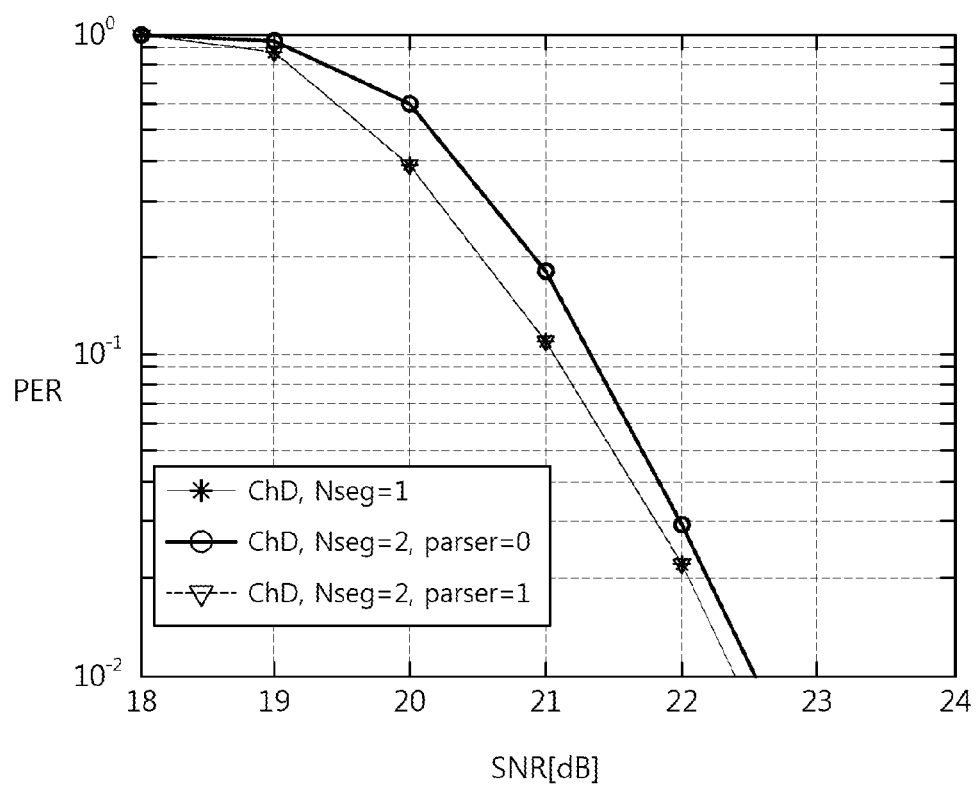
Figure 14:
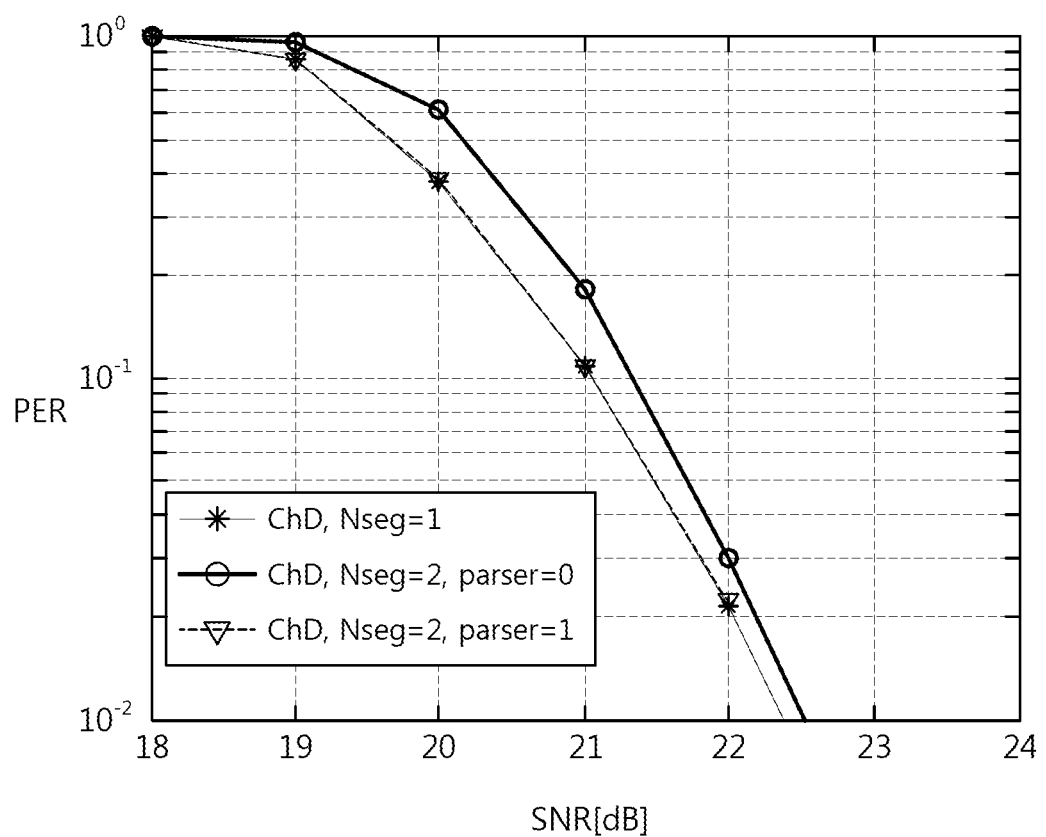

FIGS. 12 to 14 are diagrams showing simulation results. FIG. 12 shows simulation results in a case in which $N_{SS}$ is 3, a modulation scheme is 16-QAM, and R is 1/2, FIG. 13 shows simulation results in a case in which $N_{SS}$ is 3, a modulation scheme is 16-QAM, and R and 3/4, and FIG. 14 shows simulation results in a case in which $N_{SS}$ is 3, a modulation scheme is 256-QAM, and R is 3/4. 'Nseg=1' indicates that a single interleaver is used over a bandwidth of 60 MHz without segment parsing. 'Nseg=2 and parser=0' indicate that the existing segment parsing of FIG. 5 is used. 'Nseg=2 and parser=1' indicate that the suggested segment parsing of FIG. 10 is used.

It is shown that a packet error rate (PER) is increased in the case of the existing segment parsing as compared to the case in which the segment parsing is not performed; however, a PER is not almost increased in the case of the suggested segment parsing as compared to the case in which the segment parsing is not performed.

Figure 15:
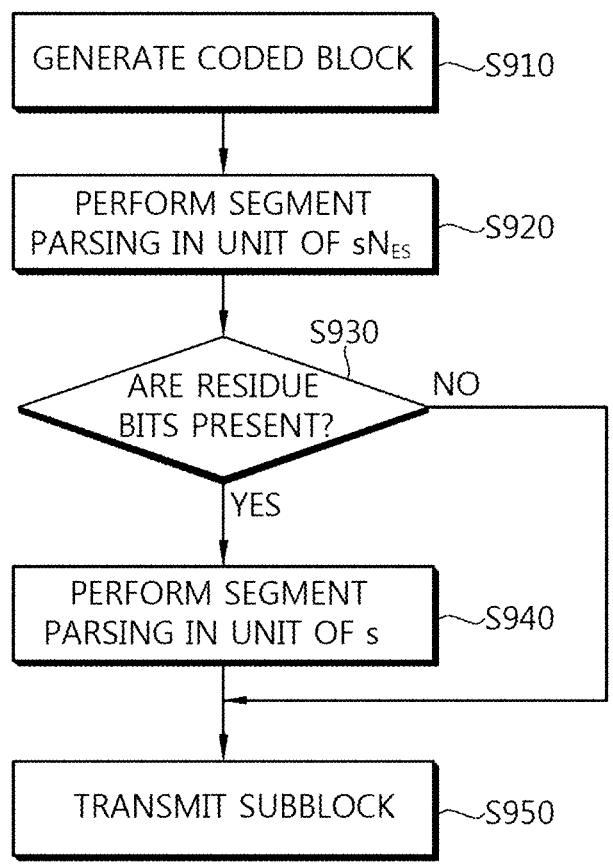
FIG. 15 is a flow chart showing a method of transmitting data according to the exemplary embodiment of the present invention.

FIG. 15 is a flow chart showing a method of transmitting data according to the exemplary embodiment of the present invention.

Information bits are encoded to generate a coded block (S910). The encoding may include spatial mapping by a stream parser as well as FEC encoding such as BCC or LDPC. The number of bits of a coded block (per a spatial stream) is $N_{CBPSS}$.

The stream parser may perform parsing based on s. Output bits of an FEC encoder are rearranged into $N_{SS}$ spatial blocks of $N_{CBPSS}$ bits. Contiguous blocks of s bits may be allocated to different spatial streams in the round robin scheme.

Segment parsing is performed in a first segment unit (S920). The first segment unit may have a value of $sN_{ES}$. Each of the encoded blocks may be parsed into M frequency subblocks of $N_{CBPSS}/M$ bits. The subblock may correspond to a bandwidth corresponding to a size of an interleaver.

When M is 2, the encoded block may be parsed to be divided into two subblocks as shown by Equation 2.

It is determined whether or not residue bits are present (S930).

When $N_{CBPSS}$ is not divided in an M×first segment unit (that is, when $N_{CBPSS}$ is not a multiple of the M×first segment unit), residue bits may be parsed in M frequency subblocks in a second segment unit (S940). The first segment unit $N_{ES}$ is times larger than the second segment unit, which may have a value of s. When M is 2, the encoded block may be parsed to be divided into two subblocks as shown by Equation 3.

Each of the subblocks is transmitted to a receiver (S950). The parsed subblocks are independently interleaved by the interleaver, mapped onto a signal constellation, and then transmitted.

Figure 16:
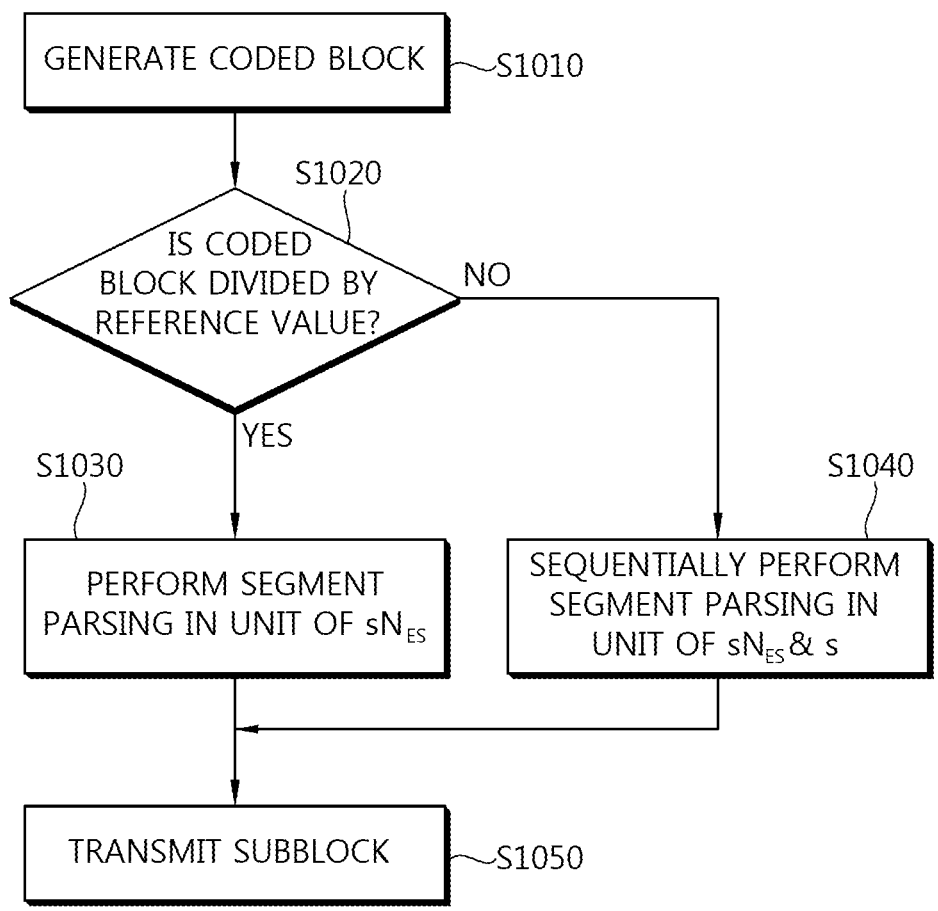
FIG. 16 is a flow chart showing a method of transmitting data according to another exemplary embodiment of the present invention.

FIG. 16 is a flow chart showing a method of transmitting data according to another exemplary embodiment of the present invention.

Information bits are encoded to generate a coded block (S1010). The encoding may include spatial mapping by a stream parser as well as FEC encoding such as BCC or LDPC. The number of bits of a coded block (per a spatial stream) is NCBPSS.

The stream parser may perform parsing based on s. Output bits of an FEC encoder are rearranged into $N_{CBPSS}$ bits of $N_{SS}$ spatial blocks. Contiguous blocks of s bits may be allocated to different spatial streams in the round robin scheme.

Whether or not $N_{CBPSS}$, which is a size of the coded block, is divided by a reference value is determined (S1020). The reference value may be an M×first segment unit.

When $N_{CBPSS}$ is divided by the M×first segment unit, segment parsing is performed in a first segment unit (S1030). The first segment unit may have a value of $sN_{ES}$. Each of the encoded blocks may be parsed into $N_{CBPSS}/M$ bits of M frequency subblocks. The subblock may correspond to a bandwidth corresponding to a size of an interleaver. When M is 2, the encoded block may be parsed to be divided into two subblocks as shown by Equation 2.

When $N_{CBPSS}$ is not divided by the M×first segment unit, residue bits may be parsed into M frequency subblocks in first and second segment units (S1040). The first segment unit $N_{ES}$ is times larger than the second segment unit. The first segment unit may have a value of $sN_{ES}$, and the second segment unit may have a value of s. The segment parsing is first performed in the first segment unit, and then performed in the second segment unit with respect to the residue bits. When M is 2, the encoded block may be parsed to be divided into two subblocks as shown by Equation 3.

Each of the subblocks is transmitted to a receiver (S1050). The parsed subblocks are independently interleaved by the interleaver, mapped onto a signal constellation, and then transmitted.

Figure 17:
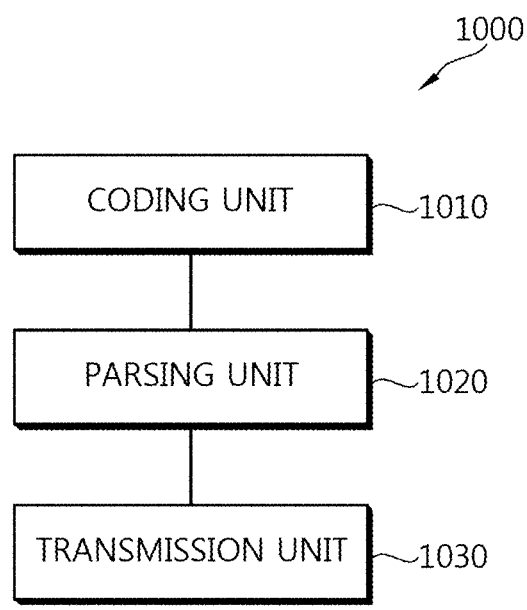
FIG. 17 is a block diagram showing a transmitter in which the exemplary embodiment of the present invention is implemented.

FIG. 17 is a block diagram showing a transmitter in which the exemplary embodiment of the present invention is implemented. The exemplary embodiments of FIGS. 15 and 16 may be implemented by the transmitter.

The transmitter 1000 includes a coding unit 1010, a parsing unit 1020, and a transmission unit 1030. The coding unit 1010 may implement functions of the FEC encoding and the stream parser of FIGS. 3 and 4. The parsing unit 1020 may implement a function of the segment parser of FIGS. 3 and 4. The transmission unit 1030 may implement functions of the interleaver and the constellation mapper of FIGS. 3 and 4.

The coding unit 1010 generates an encoded block. The parsing unit 1020 parses the encoded block into a plurality of frequency subblocks. The segment parsing Equation 2 or Equation 3 may be implemented by the parsing unit 1020. The transmitting unit 1030 transmits the subblocks to a receiver.

The coding unit 1010, the parsing unit 1020 and the transmission unit 1030 may be implemented by one or more processors. The processor may include application-specific integrated circuit (ASIC), other chipset, logic circuit and/or data processing device. The memory may include read-only memory (ROM), random access memory (RAM), flash memory, memory card, storage medium and/or other storage device. When the embodiments are implemented in software, the techniques described herein can be implemented with modules (e.g., procedures, functions, and so on) that perform the functions described herein. The modules can be stored in memory and executed by processor. The memory can be implemented within the processor or external to the processor in which case those can be communicatively coupled to the processor via various means as is known in the art.

In view of the exemplary systems described herein, methodologies that may be implemented in accordance with the disclosed subject matter have been described with reference to several flow diagrams. While for purposed of simplicity, the methodologies are shown and described as a series of steps or blocks, it is to be understood and appreciated that the claimed subject matter is not limited by the order of the steps or blocks, as some steps may occur in different orders or concurrently with other steps from what is depicted and described herein. Moreover, one skilled in the art would understand that the steps illustrated in the flow diagram are not exclusive and other steps may be included or one or more of the steps in the example flow diagram may be deleted without affecting the scope and spirit of the present disclosure.

The invention claimed is:

1. A method of receiving a data block in a wireless communication system, comprising:
 receiving two subblocks with index l=0, 1 from a transmitter,
 wherein the received codedblocks are parsed as shown:

$$y_{k,l} = \begin{cases} x_{2s \cdot N_{ES} \lfloor \frac{k}{s \cdot N_{ES}} \rfloor + l \cdot s \cdot N_{ES} + k \bmod (s \cdot N_{ES})}, \\ k = 0, 1, \ldots, \lfloor N_{CBPSS}/(2 \cdot N_{ES}) \rfloor s \cdot N_{ES} - 1 \\ x_{2s \cdot N_{ES} \lfloor \frac{k}{s \cdot N_{ES}} \rfloor + 2s \lfloor \frac{k \bmod (s \cdot N_{ES})}{s} \rfloor + k \bmod s}, \\ k = \lfloor N_{CBPSS}/(2 \cdot N_{ES}) \rfloor s \cdot N_{ES}, \ldots, \frac{N_{CBPSS}}{2} - 1 \end{cases}$$

where $$s = \max\left\{1, \frac{N_{BPSCS}}{2}\right\},$$

$N_{CBPSS}$ is the number of bits per coded block,
$N_{BPSCS}$ is the number of coded bits per subcarrier per spatial stream,
$N_{ES}$ is the number of encoders,
$\lfloor z \rfloor$ is the largest integer less than or equal to z,
z mod t is the remainder resulting from the division of integer z by integer t,
$x_m$ is the m-th bit of a block of bits, m=0 to $N_{CBPSS}-1$, and
$y_{k,l}$ is bit k of the subblock l.

2. The method of claim 1, wherein $N_{CBPSS}$ is not divisible by $2sN_{ES}$.

3. The method of claim 2, wherein each of the two subblocks is interleaved by an interleaver.

4. The method of claim 3, wherein the two subblocks correspond to two frequency bands respectively.

5. The method of claim 4, wherein each of the two frequency bands has a bandwidth of 80 MHz.

6. The method of claim 5, wherein the two frequency bands are contiguous.

7. The method of claim 5, wherein the two frequency bands are non-contiguous.

8. A receiving device configured for transmitting a data block in a wireless communication system, comprising:

a receiver configured to receive two subblocks with index l=0, 1 from a transmitter, $$y_{k,l} = \begin{cases} x_{2s \cdot N_{ES} \lfloor \frac{k}{s \cdot N_{ES}} \rfloor + l \cdot s \cdot N_{ES} + k \bmod (s \cdot N_{ES})}, \\ \quad k = 0, 1, \ldots, \lfloor N_{CBPSS}/(2s \cdot N_{ES}) \rfloor s \cdot N_{ES} - 1 \\ x_{2s \cdot N_{ES} \lfloor \frac{k}{s \cdot N_{ES}} \rfloor + 2s \lfloor \frac{k \bmod (s \cdot N_{ES})}{s} \rfloor + k \bmod s}, \\ \quad k = \lfloor N_{CBPSS}/(2s \cdot N_{ES}) \rfloor s \cdot N_{ES}, \ldots, \frac{N_{CBPSS}}{2} - 1 \end{cases}$$

wherein the received codedblocks are parsed as shown: where $$s = \max\left\{1, \frac{N_{BPSCS}}{2}\right\},$$

$N_{CBPSS}$ is the number of bits per coded block, $N_{BPSCS}$ is the number of coded bits per subcarrier per spatial stream, $N_{ES}$ is the number of encoders, $\lfloor z \rfloor$ is the largest integer less than or equal to z, z mod t is the remainder resulting from the division of integer z by integer t, $x_m$ is the m-th bit of a block of bits, m=0 to $N_{CBPSS}-1$, and $y_{k,l}$ is bit k of the subblock l.

9. The receiving device of claim 8, wherein $N_{CBPSS}$ is not divisible by $2sN_{ES}$.

10. The receiving device of claim 9, wherein each of the two subblocks is interleaved by an interleaver.

11. The receiving device of claim 10, wherein the two subblocks correspond to two frequency bands respectively.

12. The receiving device of claim 11, wherein each of the two frequency bands has a bandwidth of 80 MHz.

13. The receiving device of claim 12, wherein the two frequency bands are contiguous.

14. The receiving device of claim 12, wherein the two frequency bands are non-contiguous.

* * * * *